US008767425B2

(12) United States Patent
Terdan et al.

(10) Patent No.: US 8,767,425 B2
(45) Date of Patent: Jul. 1, 2014

(54) CIRCUIT THAT DECIPHERS BETWEEN AC AND DC INPUT SIGNALS

(71) Applicant: Rockwell Automation Technologies, Inc., Mayfield Heights, OH (US)

(72) Inventors: Dale R. Terdan, Concord Township, OH (US); Sean P. Overberger, Sr., Streetsboro, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 36 days.

(21) Appl. No.: 13/688,312

(22) Filed: Nov. 29, 2012

(65) Prior Publication Data

US 2014/0145638 A1 May 29, 2014

(51) Int. Cl.
*H02M 1/10* (2006.01)
(52) U.S. Cl.
USPC .............. 363/142; 363/143; 363/89; 363/97; 315/86; 315/87; 315/294; 315/312
(58) Field of Classification Search
CPC ............ H02M 1/10; H02J 9/00; H05B 37/00; G06F 1/263
USPC ........ 363/142, 143, 89, 97, 124–127; 315/86, 315/87, 130, 131, 247, 291, 294, 307, 312
See application file for complete search history.

(56) References Cited

U.S. PATENT DOCUMENTS

| | | | | |
|---|---|---|---|---|
| 4,977,351 A * | 12/1990 | Bavaro et al. | ................... | 315/87 |
| 5,737,204 A * | 4/1998 | Brown | ............................. | 363/89 |
| 5,824,990 A * | 10/1998 | Geissler et al. | .......... | 219/130.21 |
| 6,903,950 B2 * | 6/2005 | Afzal et al. | .................... | 363/142 |
| 7,859,874 B2 * | 12/2010 | Bovitz | ............................ | 363/142 |
| 2013/0020993 A1 * | 1/2013 | Taddeo et al. | ................. | 320/109 |

* cited by examiner

*Primary Examiner* — Haiss Philogene
(74) *Attorney, Agent, or Firm* — Boyle Fredrickson, S.C.

(57) ABSTRACT

Electronic devices require correct power in order to operate correctly. Receiving an incorrect power signal could potentially result in immediate and/or long term harm to the electronic device and/or catastrophic conditions. Certain devices, such as programmable logic controller ("PLC") modules, may provide variable power to electronic devices, such as field devices comprising sensors and/or actuators. The present inventors have recognized that deciphering between AC and DC input signals before coupling electronic devices to such power sources may advantageously avoid harmful and/or catastrophic conditions. Aspects of the present invention provide an electronic circuit for deciphering between an AC and a DC input signal. Systems and methods are also described.

20 Claims, 7 Drawing Sheets

CIRCUIT THAT DECIPHERS BETWEEN AC AND DC INPUT SIGNALS

BACKGROUND OF THE INVENTION

The present invention relates to electronic circuits, and in particular, to an electronic circuit that deciphers between AC and DC input signals.

Electronic devices typically use power from alternating current ("AC") and/or direct current ("DC") sources. For example, an electronic device may receive an AC power signal from an AC power source for its power, or may receive an AC power signal from an AC power source for internally deriving a DC power signal for its power, or may receive a DC power signal from a DC power source for its power. Some electronic devices could use both AC power signals and DC power signals concurrently for its power. In many industrial applications, AC power signals may be provided by AC power sources between 87 to 265 Volts at 50 to 60 Hertz, and DC power signals may be provided by DC power sources between 18 to 32 Volts.

Industrial controllers, such as programmable logic controllers ("PLC's"), are specialized electronic computer systems used for the control of industrial processes or machinery, such as in a factory environment. Industrial controllers differ from conventional computers in a number of ways. Physically, they are constructed to be substantially more robust against shock and damage and to better resist external contaminants and extreme environmental conditions. The processors and operating systems are optimized for real-time control and execute languages allowing ready customization of programs to comport with a variety of different controller applications. Industrial controllers may also have a user interface for accessing, controlling and/or monitoring the industrial controller, such as through a locally connected terminal having a keyboard, mouse and display.

Industrial controllers often have a modular architecture that allows different numbers and types of network cards or adapters to be used to connect the controllers to electronic devices or field devices, such as sensors and, actuators for controlling and interacting with industrial processes and/or machines. Field devices may be dedicated to a particular function, such as detecting an input signals or running a motor, and may be located at convenient control points near the industrial processes and/or machines. Field devices may receive AC and/or DC power locally, or in preferred applications, may receive AC and/or DC power from the industrial controller.

Electronic devices or field devices require correct power in order to operate correctly. Receiving an incorrect power signal could potentially result in immediate and/or long term harm to the electronic device and/or catastrophic conditions, including possible fire, personal injury or death.

SUMMARY OF THE INVENTION

The present inventors have recognized that deciphering between AC and DC input signals before coupling electronic devices, such as field devices, to a power source may advantageously avoid harmful and/or catastrophic conditions. As such, the present inventors have invented circuits, applications and methods for deciphering between AC and DC input signals before coupling electronic devices to a power source.

Aspects of the present invention provide an electronic circuit for deciphering between an AC and a DC input signal comprising: an AC filter receiving an input signal and coupled to a first leg, the AC filter permitting an AC signal to pass to the first leg and preventing a DC signal from passing to the first leg; and a DC filter receiving the input signal and coupled to a second leg, the DC filter permitting a DC signal to pass to the second leg and preventing at least part of an AC signal from passing to the second leg. A DC signal passing to the second leg causes the second leg to produce a second output for indicating a DC input signal, and an AC signal passing to the first leg causes the first leg to produce a first output for indicating an AC input signal and causes a lock out circuit to prevent the second leg from producing the second output.

The AC filter may comprise a series capacitor, and the DC filter may comprise a series diode.

The first and second outputs may be coupled together to produce a third output for indicating an AC or a DC input signal. The first and second outputs may be coupled to light emitting diodes, and/or may produce audible tones and/or digital data signals.

The lock out circuit may comprise a transistor in the second leg controlled by circuitry in the first leg.

Another embodiment may provide a programmable logic controller module for providing power to a field device comprising: an enclosure; an electrical terminal on the enclosure coupled to a power signal; an AC filter contained in the enclosure receiving the power signal and coupled to a first leg of a circuit, the AC filter permitting an AC signal to pass to the first leg and preventing a DC signal from passing to the first leg; and a DC filter contained in the enclosure receiving the power signal and coupled to a second leg of the circuit, the DC filter permitting a DC signal to pass to the second leg and preventing at least part of an AC signal from passing to the second leg. A DC signal passing to the second leg causes the second leg to produce a second output for indicating a DC power signal, and an AC signal passing to the first leg causes the first leg to produce a first output for indicating an AC power signal and causes a lock out circuit to prevent the second leg from producing the second output.

Yet another embodiment may provide a method for deciphering between an AC and a DC input signal comprising: (a) receiving an input signal; (b) permitting an AC component of the input signal to pass to a first leg of a circuit while preventing a DC component of the input signal from passing to the first leg; (c) permitting a DC component of the input signal to pass to a second leg of the circuit while preventing at least part of an AC component of the signal from passing to the second leg; and (d) producing a second output for indicating a DC input signal following a DC component of the input signal passing to the second leg, and producing a first output for indicating an AC input signal and preventing the second leg from producing the second output following an AC component of the input signal passing to the first leg.

These and other objects, advantages and aspects of the invention will become apparent from the following description. The particular objects and advantages described herein may apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

DETAILED DESCRIPTION OF THE PREFERRED EMBODIMENT

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance, with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

Figure 1:
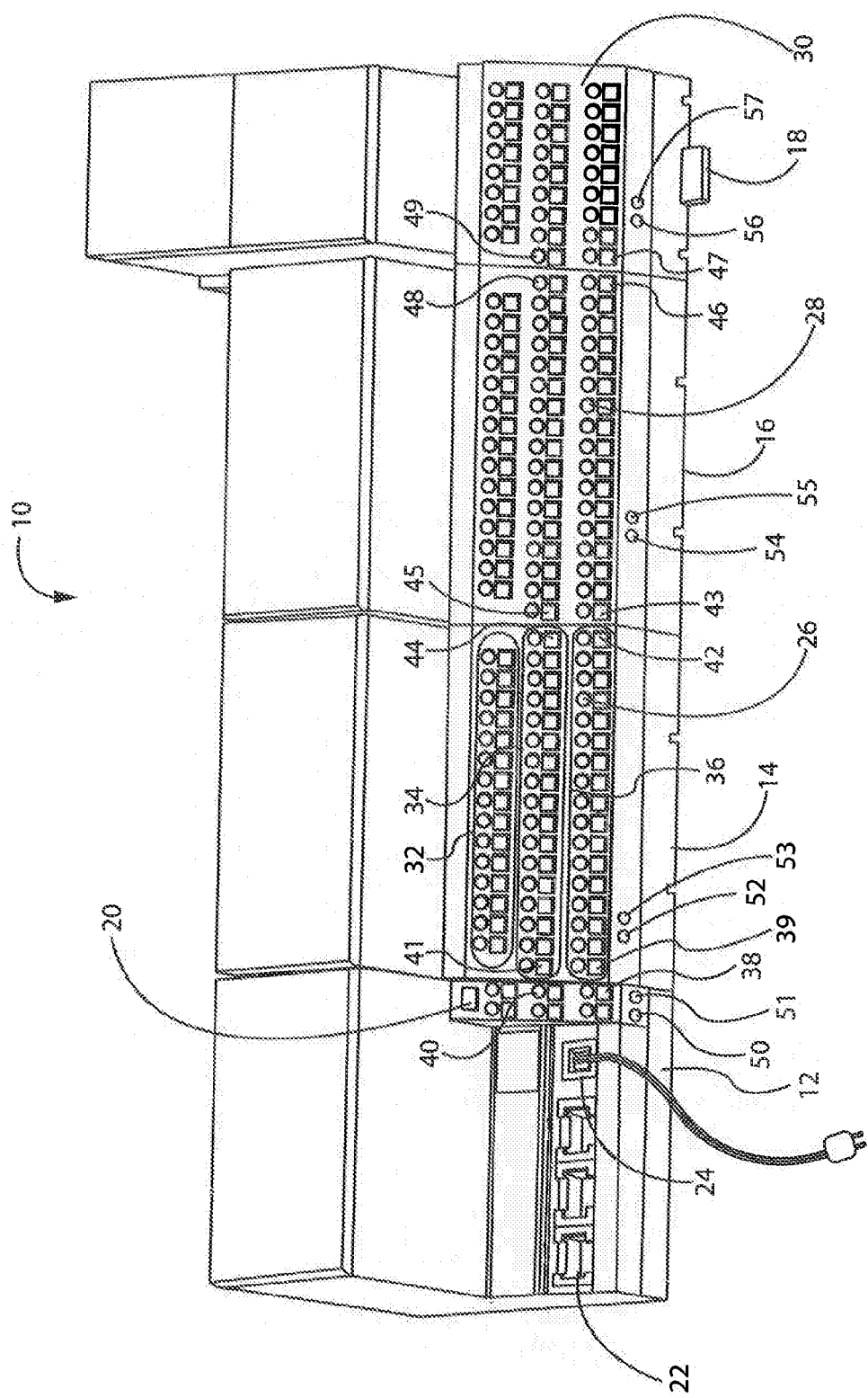
FIG. 1 is an isometric view of a bank of programmable logic controller ("PLC") modules for an industrial control system in accordance with an embodiment of the present invention.

Referring now to the drawings wherein like reference numbers correspond to similar components throughout the several views and, specifically, referring to FIG. 1, the present invention shall be described in the context of a bank of programmable logic controller ("PLC") modules 10 for an industrial control system in accordance with an embodiment of the present invention. The modules 10 include a series of enclosures arranged from left to right, side by side, with complex shapes that may be generally cubic. The series of enclosures may include a left most module 12, followed by a first double, vertical terminal I/O module 14, followed by a second double, vertical terminal I/O module 16 and followed by a right most single, vertical terminal I/O module 18. Each module, may be held in close proximity to the other by attachment to a DIN rail (not shown) thereby facilitating electrical connections side by side. The electrical connections side by side may provide a common system backplane to form a network ring topology and may pass a module power signal starting from the left most module 12 to each neighboring module. Each module may also include one or more internal bus slots for releasably receiving a function card and/or equivalently embedded logic.

An alternative embodiment may instead provide a single PLC module, a bank of modules with greater separation and having electrical connections supported by cabling, or any other electronic-based system that provides power for another device.

The left most module 12 may comprise a plurality of connectors 22, and visual displays and/or LED's 20 for system monitoring, located on one or more respective surfaces. The connectors 22 may include connections for networking, such as a plurality of RJ-45 network connectors for network ring connectivity of the bank and for access to the bank, for a locally connected terminal, such as a Universal Serial Bus ("USB") and/or IEEE 1394 connector, and a power connector 24 for powering the left most module 12, and in turn, the bank of PLC modules 10. Any other advantageous connection may also be provided as understood in the art.

I/O modules 14, 16 and 18 may each comprise a plurality of electrical terminals (or terminal blocks, or screw terminals) 26, 28 and 30, respectively, on each enclosure for receiving electrical conductors exposed on the surface of the enclosure. The conductors may couple to one or more external field devices (not shown), such as sensors and/or actuators interacting with industrial controlled processes and/or machines. Within each I/O module 14, 16 and 18, the electrical terminals may be routed to one or more internal bus slots, and in turn, to releasably received function cards held within the one or more internal bus slots, or to equivalently embedded logic.

The electrical terminals 26, 28 and 30 on each of the I/O modules 14, 16 and 18 may be divided into a first row of electrical terminals 32 for communicating with field devices, a second row of electrical terminals 34 for providing a ground signal to the field devices and a third row of electrical terminals 36 for providing a power signal to the field devices. In a preferred embodiment, each of the electrical terminals in the second row 34 of a particular I/O module may be coupled together, and each of the electrical terminals in the third row 36 of a particular I/O module may be coupled together. However, in an alternative embodiment, some or all of the electrical terminals in the second row 34 and/or some or all of the electrical terminals in the third row 36 may be isolated from others to provide a plurality of power and/or ground signals from the same I/O module, such as AC and DC power signals.

Power originating from a power source may be provided as alternating current ("AC"), such as in the range of 87 to 265 Volts at 50 to 60 Hertz, and/or as direct current ("DC"), such as in the range of 18 to 32 Volts. The left most module 12 may receive, for example, an AC power signal from an AC power source (or a DC power signal from a DC power source) via power connector 24. In a daisy chain topology, the left most module 12 may then provide the power signal at electrical terminal 38, and a ground signal at electrical terminal 40, with the electrical terminals 38 and 40 each exposed on the surface of the enclosure of the left most module 12. The power signal may be passed from the left most module 12 to the neighboring I/O module 14 via a jumper connection between the electrical terminal 38 on the left most module 12 and the electrical terminal 39 on the I/O module 14, and the ground signal may be passed via a jumper connection between the electrical terminal 40 on the left most module 12 and the electrical terminal 41 on the I/O module 14. The power signal may then be passed from the I/O module 14 to the next neighboring I/O module 16 via a jumper connection between the electrical terminal 42 on the I/O module 14 and the electrical terminal 43 on the I/O module 16, and the ground signal may be passed via a jumper connection between the electrical terminal 44 on the I/O module 14 and the electrical terminal 45 on the I/O module 16. The power signal may then be passed from the I/O module 16 to the next neighboring I/O module 18 via a jumper connection between the electrical terminal 46 on the I/O module 16 and the electrical terminal 47 on the I/O module 18, and the ground signal may be passed via a jumper connection between the electrical terminal 48 on the I/O module 16 and the electrical terminal 49 on the I/O module 18.

Each of the I/O modules 14, 16 and 18 may include, for example, one or more light emitting diodes ("LED's") 52, 53, 54, 55, 56 and 57 reflecting the presence and/or nature of the power signal provided. Similarly, the left most module 12 may include, for example, LED's 50 and 51. One LED may indicate the presence of an AC power signal, whereas another LED may indicate the presence of a DC power signal. Alternatively, a single bi-colored LED may be used in which red or other color illumination indicates the presence of an AC power signal, and a yellow or different color illumination indicates the presence of a DC power signal. Also, a lack of illumination may indicate a lack of any type of power available. Various LED colors and affixed labeling may also be employed.

In an alternative embodiment, the left most module 12 may instead provide the power and ground signals in a daisy chain topology to neighboring I/O modules via side by side electrical connections as described with respect to FIG. 2 below. In another alternative embodiment, one or more of the I/O modules 14, 16 and 18 may receive, for example, a power signal from a power source via dedicated local power connectors in a star topology, and may, in turn, provide the power and ground signals at the electrical terminal exposed on the surface of the enclosure of the I/O modules as desired. Of course, any combination of the above techniques may be employed as understood by one of ordinary skill in the art.

Figure 2:
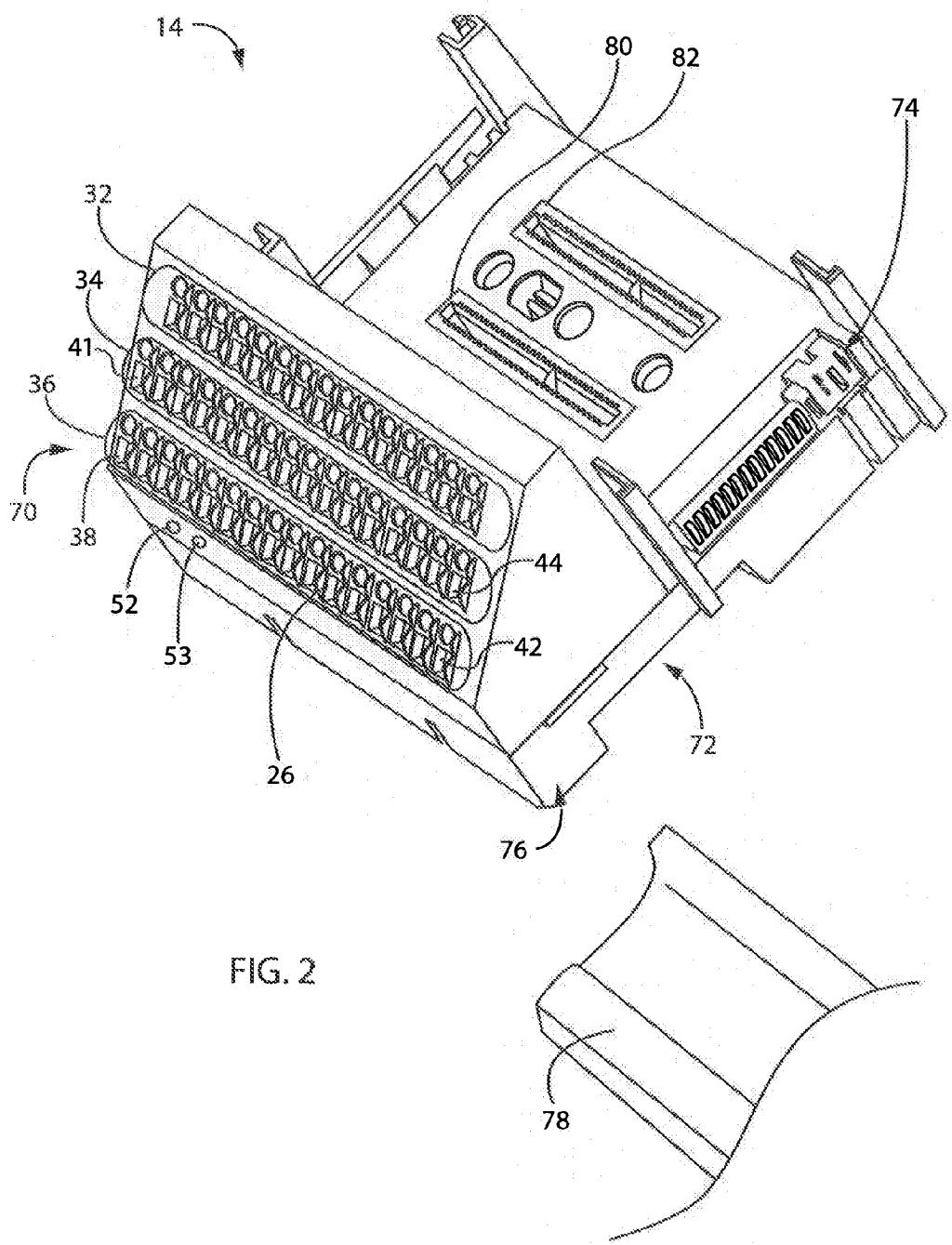
FIG. 2 is an isometric view of an I/O module in accordance with the embodiment of FIG. 1.

Referring now to FIG. 2, an isometric view of the I/O module 14 is shown. I/O module 14 may comprise an enclosure providing a left flanking side 70 and a right flanking side 72. Each side may further comprise a releasable electrical connector 74 with a mechanical mechanism supported on each flanking side exposed to connect adjacent modules on the left and right sides. I/O module 14 may further comprise a releasable mechanical connector 76 for holding the I/O module 14 in proximity to the modules on the left and right sides. The releasable mechanical connector may be adapted to hold the I/O module 14 by attachment to a DIN rail 78. The I/O module 14 may include internal bus slots 80 and 82 for releasably receiving function cards.

Figure 3:
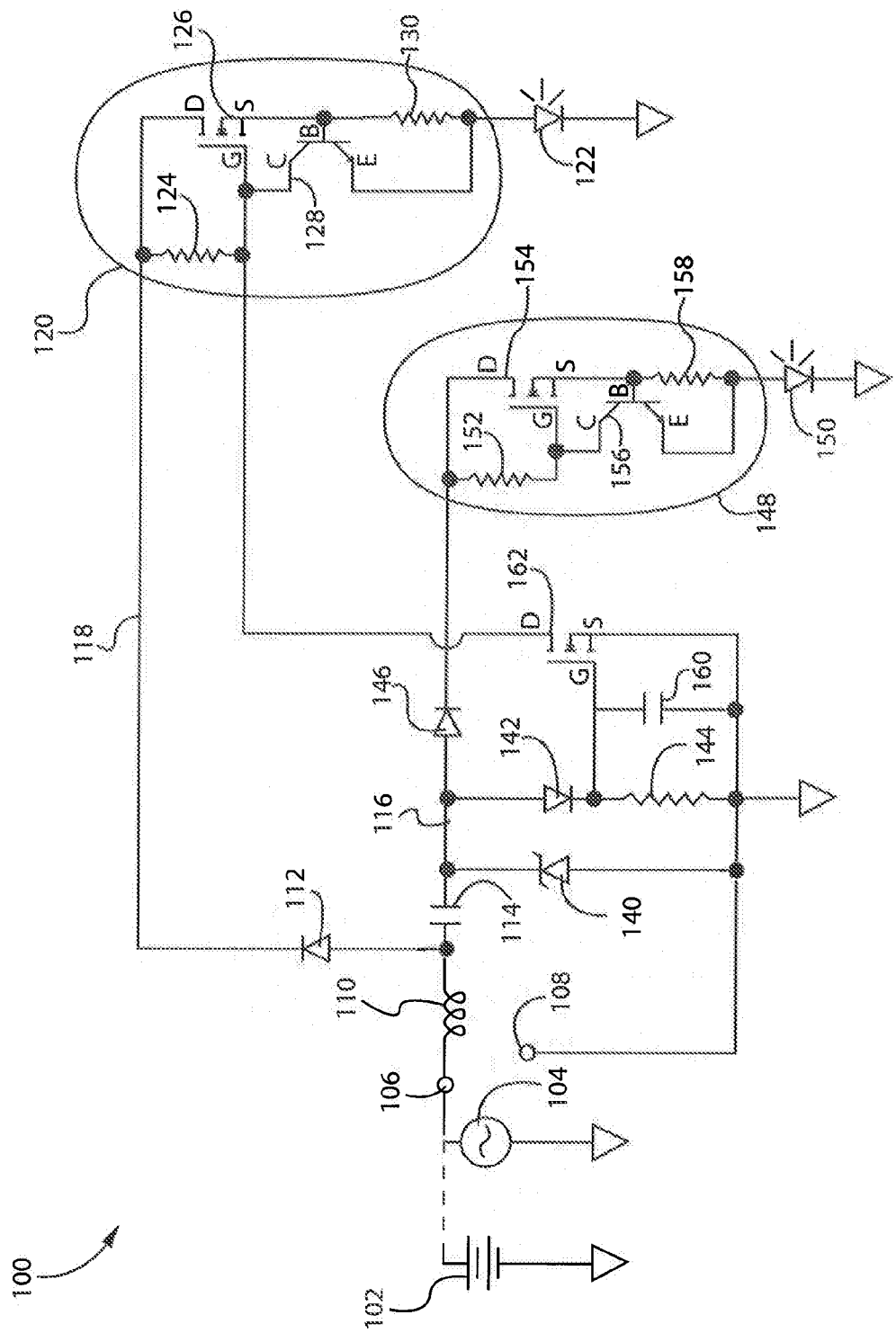
FIG. 3 is an electronic circuit that deciphers between AC and DC input signals in accordance with an embodiment of the present invention.

Referring now to FIG. 3, an electronic circuit 100 that deciphers between AC and DC input signals in accordance with an embodiment of the present invention is shown. The circuit 100 may receive a positive DC input signal 102 or an AC input signal 104, and a ground signal, for example, at a pair of electrical terminals 106 and 108. The input signal may then couple to a series inductor 110, which may be 10 mH, providing AC filtering and choke. The input signal may then be sent in two directions, a first direction having a DC filter, herein comprising a series diode 112, which may be rated to +600 Volts DC, and a second direction having an AC filter, herein comprising a series capacitor 114, which may be about 1 µF. The AC filter permits an AC signal to pass to a first leg 116 of the circuit 100 and prevents a DC signal from passing to the first leg 116. The positive voltage with respect to ground in the first leg 116 during an AC positive excursion is the voltage of Zener diode 140, wherein the cathode of the Zener diode 140 is coupled to the AC filter and the anode of the Zener diode 140 is coupled to ground; the AC negative excursion is the forward voltage drop of the Zener diode 140. The DC filter permits a DC signal to pass to the second leg 118 of the circuit 100, and allows only the positive AC signal to the second leg 118, thereby preventing at least part of an AC signal from passing to the second leg 118.

If the input signal is the positive DC input signal 102, the signal (output of the DC filter) passes to the second leg 118 to produce an output for indicating a positive DC input signal. This may occur by the signal (output of the DC filter) passing to a constant current source 120 in series with an LED 122 coupled to ground. The constant current source 120 may comprise, for example, a larger resistor 124, which may be about 2 MΩ, coupled between the gate and drain of an n-channel metal oxide semiconductor field effect transistor ("MOSFET") 126, an NPN bipolar junction transistor ("BJT") 128 with the base of the BJT 128 coupled to the source of the MOSFET 126 and the collector of the BJT 128 coupled to the gate of the MOSFET 126, and a smaller resistor 130, which may be about 100Ω, coupled between the base and the emitter of the BJT 128. In operation, following the DC filter, the signal passes to the second leg 118, enters the constant current source 120 at the drain of the MOSFET 126, exits the constant current source 120 at the emitter of the BJT 128 (having a current strength of about 10 mA), and illuminates the LED 122.

If, on the other hand, the input signal is the AC input signal 104, the signal (output of the AC filter) passes to the first leg 116 to produce an output for indicating an AC input signal and causes a lock out circuit to prevent the second leg 118 from producing the output for indicating a DC input signal. This may occur by the signal (output of the AC filter) in the first leg 116 being, rectified and passed in two directions: (i) to a diode 146, then to a constant current source 148 in series, then to an LED 150 in series coupled to ground, and (ii) to circuitry in the first leg 116 used to control circuitry in the second leg 118. The signal (output of the AC filter) may be rectified in the first leg 116 by a Zener diode 140 with the cathode of the Zener diode 140 coupled to the signal (output of the AC filter) and the anode of the Zener diode 140 coupled to ground, a diode 142 with the anode of the diode 142 coupled to the signal (output of the AC filter) and the cathode of the diode 142 coupled to a resistor 144 to ground, which may be about 46.4 KΩ, and a capacitor 160, which may be about 2.2 µF, coupled between the cathode of the diode 142 and ground (in parallel with the resistor 144).

As mentioned above, the signal (output of the AC filter), which has been rectified, may be passed to the diode 146, then to the constant current source 148 in series, which may comprise, for example, a larger resistor 152, which may be about 10 KΩ, coupled between the gate and drain of an n-channel MOSFET 154, an NPN BJT 156 with the base of the BJT 156 coupled to the source of the MOSFET 154 and the collector of the BJT 156 coupled to the gate of the MOSFET 154, and a smaller resistor 158, which may be about 49.9Ω, coupled between the base and the emitter of the BJT 128, then to the LED 150 in series coupled to ground. In operation, following the diode 146, the signal passes to the constant current source 148 at the drain of the MOSFET 154, exits the constant current source 148 at the emitter of the BJT 156 (having a current strength of about 10 mA), and illuminates the LED 150.

Also as mentioned above, the signal (output of the AC filter), which has been rectified, may be used (indirectly) to control circuitry in the second leg 118. For example, the cathode of the diode 142 may be coupled to the gate of an n-channel MOSFET 162. The source of the MOSFET 162 may be coupled to ground, and the drain of the MOSFET 162 may be coupled to the gate of the MOSFET 126 in the second leg 118. In operation, following rectification of the signal (output of the AC filter), the gate of the MOSFET 162 is held high, causing the MOSFET 162 to pull the gate of the MOS- FET 126 low, which thereby inhibits current from flowing through the constant current source 120 to illuminate the LED 122.

In an alternative embodiment, the circuit 100 may be adapted to produce an additional output for indicating a negative DC input signal, or may be adapted to produce an output for indicating a negative DC input signal instead of a positive DC input signal. For example, in the circuit 100, if an additional output for indicating a negative DC input signal is desired, the circuit components 112, 124, 126, 128, 130 and 122 may be replicated as components 112', 124', 126', 128', 130' and 122' in an additional leg in which the direction of the diode 112' is reversed, the MOSFET 126' is a p-channel MOSFET, the BJT 128' is a PNP BJT and the direction of the LED 122' is reversed. Similarly, if an output for indicating a negative DC input signal is desired instead of an output for indicating a positive DC input signal, the circuit components 112, 124, 126, 128, 130 and 122 may be replaced by the components 112', 124', 126', 128', 130' and 122' in which the direction of the diode 112' is reversed, the MOSFET 126' is a p-channel MOSFET, the BJT 128' is a PNP BJT and the direction of the LED 122' is reversed.

Figure 4:
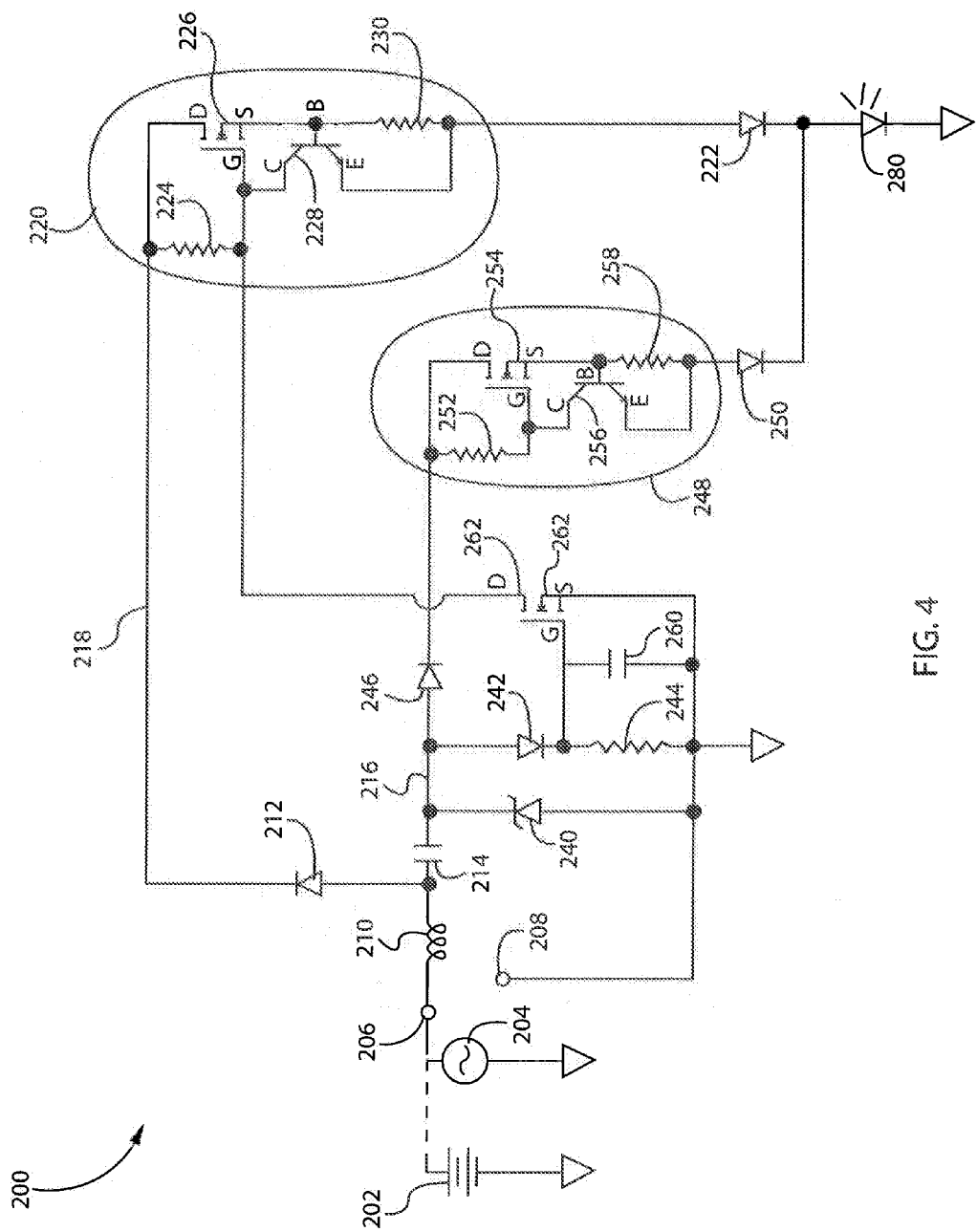
FIG. 4 is another embodiment of an electronic circuit that deciphers between AC and DC input signals.

Referring now to FIG. 4, another embodiment of an electronic circuit 200 that deciphers between AC and DC input signals is shown. Similar to the circuit 100 as described above with respect to FIG. 3, in the circuit 200, if an input signal is a DC input signal 202, the signal passes to a constant current source 220 in a second leg 218, and if the input signal is an AC input signal 204, the signal passes to a first leg 216 in which it is rectified and passed in two directions: (i) to a diode 246, then to a constant current source 248 in series, and (ii) to circuitry in the first leg 216 used to control circuitry in the second leg 218. However, unlike the circuit 100 as described above, the constant current source 220 in the second leg 218 and the constant current source 248 in the first leg 216 do not each couple to LED's. Instead, the constant current source 220 in the second leg 218 couples in series to the anode of a diode 222, and the constant current source 248 in the first leg 216 couples in series to the anode of a diode 250. The cathode of the diode 222 and the cathode of the diode 250 may couple together and, in turn, couple in series to the anode of LED 280. In operation, if the input signal is either the DC input signal 202 or the AC input signal 204, the LED 280 will illuminate. In an alternative embodiment, the diodes 222 and 250 may be replaced with LED's, providing an electronic circuit that deciphers between AC and DC input signals with three LED's.

As described above with respect to FIG. 1, Various LED colors and affixed labeling may also be employed. In addition, alternative embodiments may provide other output mechanisms for signaling between AC and DC input signals. For example, instead of or in addition to LED's, a speaker may be configured in each leg, including with push button activation or silencing, to produce variable audible tones to distinguish between AC and DC input signals present. Also, instead of or in addition to LED's, the output of each leg may be digitized and coupled as binary bits to a logic controller to flag the presence of AC or DC input signals. Indeed, a variety of other alert mechanisms may be employed as understood by one of ordinary skill in the art.

Figure 5:
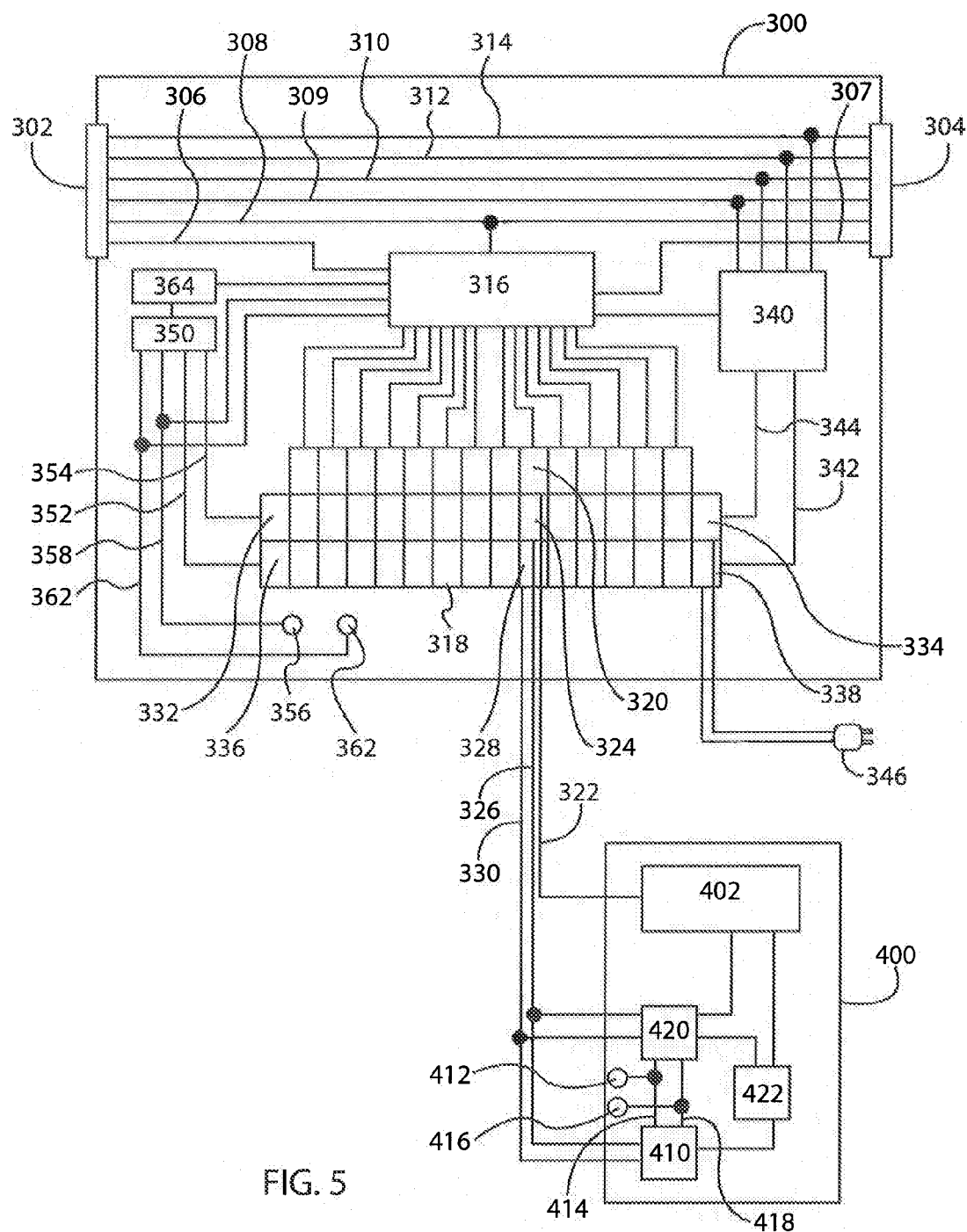
FIG. 5 is a diagram showing an industrial controller module and a field device, each in accordance with an embodiment of the present invention.

Referring now to FIG. 5, a diagram showing an industrial controller I/O module 300 and a field device 400, each in accordance with an embodiment of the present invention, is shown. The I/O module 300 may comprise a left electrical connector 302 and a right electrical connector 304 on flanking sides exposed to connect to adjacent modules on the left and right sides (not shown). The electrical connector 302 and 304 may provide a common system backplane, including communications, power and ground signals as described. A first communications signal 306 may couple between the left electrical connector 302 and a logic controller 316 in the I/O module 300, and a second communications signal 307 may couple between the logic controller 316 and the right electrical connector 304 to form a network ring with the adjacent modules on the left and right sides. The logic controller 316 may comprise, for example, a function card releasably received in an internal bus slot and/or embedded logic. A module power signal 308, which may be a DC power signal from the adjacent module on the left side, may couple between the left electrical connector 302 and the right electrical connector 304 and may provide power to the I/O module 300 as necessary, including to the logic controller 316.

The logic controller 316 may couple to a plurality of electrical terminals (or terminal blocks, or screw terminals) 318 on the surface of the enclosure of the I/O module 300. The electrical terminals 318 may receive electrical conductors which may couple to one or more external field devices. The electrical terminals 318 are divided into a first row for communicating with field devices, a second row for providing a ground signal to the field devices and a third row for providing a power signal to the field devices. In this embodiment, each of the electrical terminals 318 in the second row are coupled together, providing a common ground signal, and each of the electrical terminals 318 in the third row are, coupled together, providing a common power signal. Here, electrical terminal 320 in the first row communicates with a field logic controller 402 in a field device 400 via conductor 322, electrical terminal 324 in the second row provides a ground signal to the field device 400 via conductor 326, and electrical terminal 328 in the third row provides a power signal to the field device 400 via conductor 330.

In one embodiment, an electrical terminal in the second row of the I/O module may receive a power and/or ground signal from one neighboring I/O module via a jumper connection, and another electrical terminal of, the I/O module may provide the power and/or ground signal to another neighboring I/O module via another jumper connection. For example, I/O module 300 may receive a ground signal at electrical terminal 332 in the second row from the adjacent module on the left side and may provide the ground signal at electrical terminal 334 in the second row to the adjacent module on the right side, and I/O module 300 may receive a power signal at electrical terminal 336 in the third row from the adjacent module on the left side and may provide the power signal at electrical terminal 338 in the third row to the adjacent module on the right side.

In another embodiment, the I/O module 300 may instead receive and provide power and/or ground signals via the electrical connections side by side. For example, a DC power signal 309 and ground signal 310 provided from the adjacent module on the left side may couple between the left electrical connector 302 and the right electrical connector 304 and may couple to power logic 340. An AC power signal 312 and ground signal 314 also provided from the adjacent module on the left side may also couple between the left electrical connector 302 and the right electrical connector 304 and may also couple to the power logic 340. The power logic 340, which may be controlled by the logic controller 316, may select which power and/or ground signals to couple to which electrical terminals as desired. For example, the power logic 340 may provide the DC power signal 309 to electrical terminal 338 in the third row via connection 342, and the power logic 340 may provide the ground signal 310 to electrical terminal 334 in the second row via connection 344.

In yet another alternative embodiment, the I/O module 300 may receive, for example, power and/or ground signals from a power source via connection 346, and may provide the power and/or ground signals to the electrical terminals as desired. Of course, any combination of the above techniques may be employed as understood by one of ordinary skill in the art. As such, the I/O module 300 may provide a detection and/or indication of the nature of power being provided, and/or the field device may provide a detection and/or indication of the nature of power being received.

Here, the I/O module 300 includes an electronic circuit 350 that deciphers between AC and DC input signals in accordance with an embodiment of the present invention. The circuit 350 may receive a power signal from electrical terminal 336 in the third row via connection 352, and may receive a ground signal from electrical terminal 332 in the second row via connection 354. In response, the circuit 350 may illuminate LED 356 for indicating a DC power signal via connection 358, or may illuminate LED 360 for indicating an AC power signal via connection 362. The I/O module 300 may also include detection logic 364 coupled between the circuit 350 and the logic controller 316 which may, for example, provide a digitized output to the logic controller 316 to flag the presence of AC or DC input signals, or may adjust one or more other properties of the circuit 350.

Similarly, the field device 400 includes an electronic circuit 410 that deciphers between AC and DC input signals in accordance with an embodiment of the present invention. The circuit 410 may receive a power signal from electrical terminal 328 in the third row via conductor 330, and may receive a ground signal from electrical terminal 324 in the second row via conductor 326. In response, the circuit 410 may illuminate LED 412 for indicating a DC power signal via connection 414, or may illuminate LED 416 for indicating an AC power signal via connection 418. The field device 400 may also include field power logic 420 which may, upon the circuit 410 indicating safe power to the field power logic 420 via connections 414 and 418, safely provide power to the field logic controller 402 and the field device 400 as necessary. The field device 400 may also include field detection logic 422 coupled between the circuit 410 and the field logic controller 402, and/or coupled between the circuit 410 and the field power logic 420, which may, for example, provide a digitized output to the field logic controller 402 and/or the field power logic 420 to flag the presence of AC or DC input signals, or may adjust one or more other properties of the circuit 410.

Figure 6:
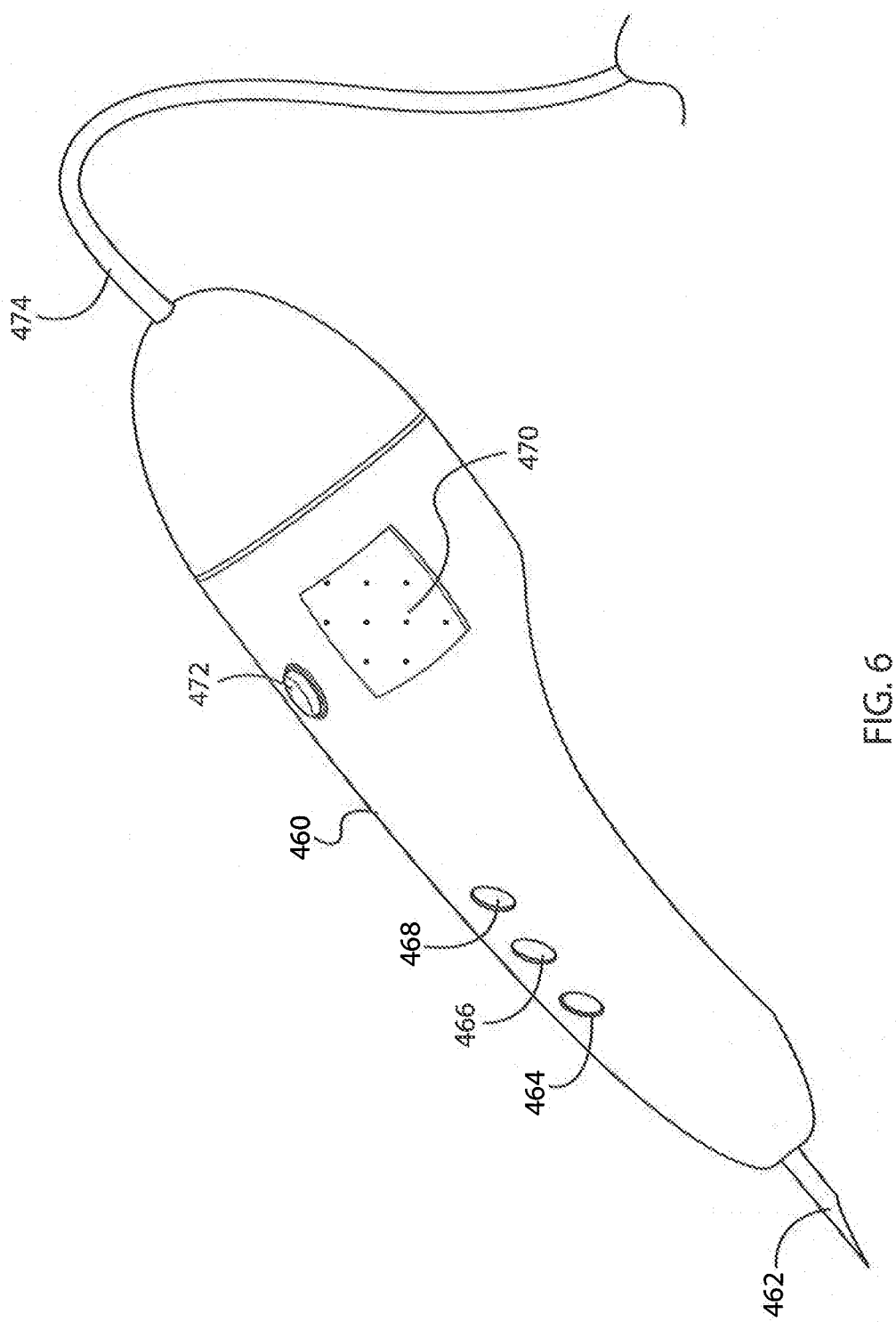
FIG. 6 is an isometric view of a handheld diagnostic probe in accordance with an embodiment of the present invention.

Referring now to FIG. 6, an isometric view of a handheld diagnostic probe 460 in accordance with an embodiment of the present invention is shown. The probe 460 includes an electronic circuit that deciphers between AC and DC input signals in accordance with an embodiment of the present invention. Such a probe may be used, for example, by a technician to safely determine the presence of AC and DC input signals while reducing the risk of catastrophic results. A tip 462 on the probe 460 may touch, for example, an electrical terminal exposed on the surface of an I/O module. Accordingly, the tip 462 may input the resulting signal to the circuit. In response, the circuit may illuminate LED 464 for indicating a DC power signal, or may illuminate LED 466, and/or may illuminate LED 468 for indicating a DC or AC power signal. The probe 460 may also include a speaker 470, which may produce variable audible tones to distinguish between AC and DC input signals present, and a push button 472 which may silence such tones. The probe 460 may also include cabling 474 for providing power, ground and data communications, including providing a digitized output to a remote device for indicating the presence of an AC or DC input signal, though in an alternative embodiment the probe 460 may include such features wirelessly.

Figure 7:
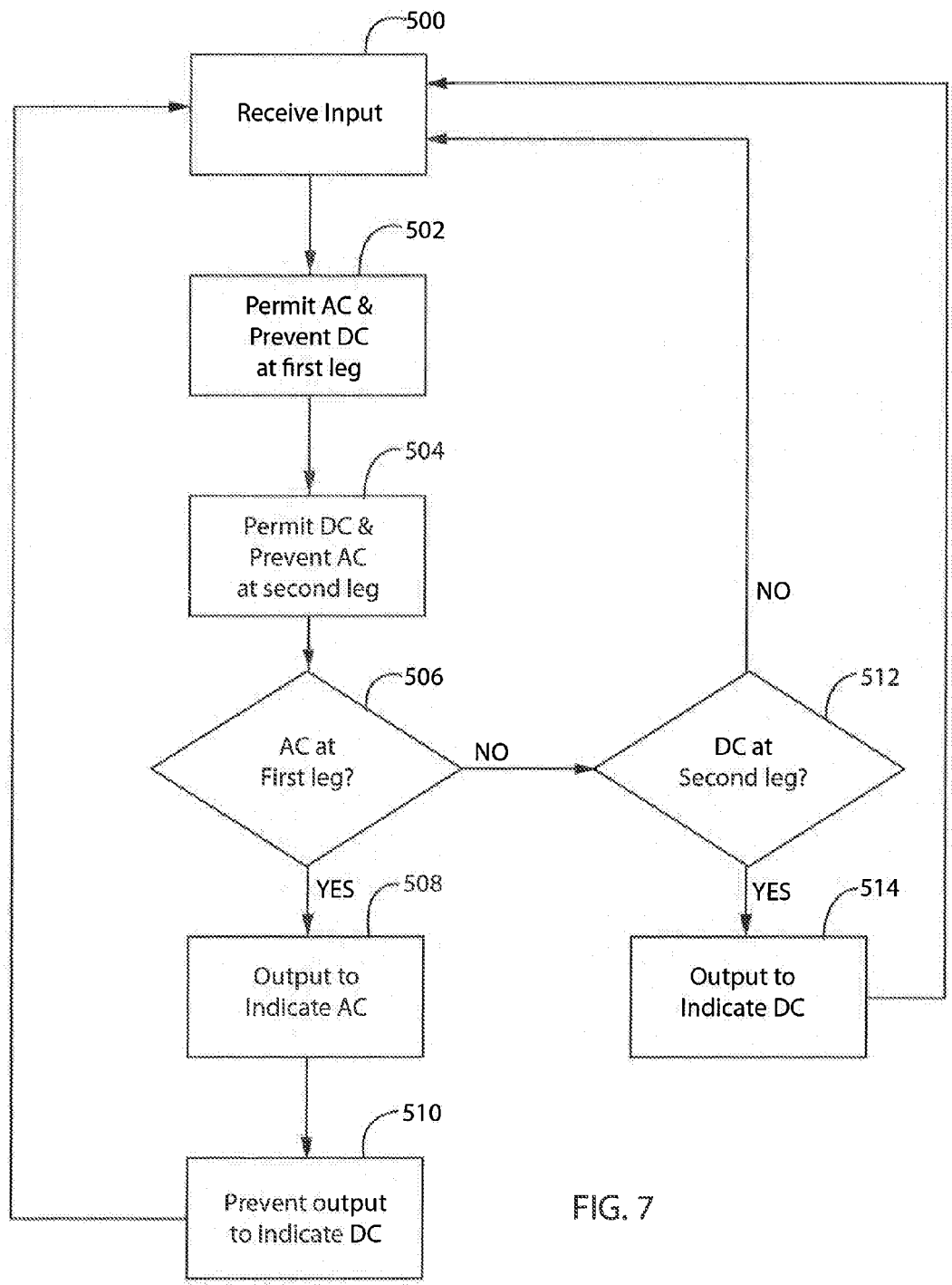
FIG. 7 is a flow diagram illustrating a method for deciphering between an AC and a DC input signal in accordance with an embodiment of the present invention.

Referring now to FIG. 7, a flog diagram illustrating a method for deciphering between an AC and a DC input signal in accordance with an embodiment of the present invention. In step 500, an input signal is received. Next, in step 502, an AC component of the input signal is permitted to pass to a first leg of a circuit while a DC component of the input signal is prevented from passing to the first leg. Next, in step 504, a DC component of the input signal is permitted to pass to the second leg of the circuit while an AC component of the signal is prevented from passing to the second leg. Next, in decision step 506, it is determined if an AC component of the input signal passed to the first leg. If an AC component of the input signal passed to the first leg, then, in step 508, a first output for indicating an AC input signal is produced, then, in step 510, the second leg is prevented from producing a second output. However, as determined in decision step 506, if an AC component of the input signal did not pass to the first leg, then, in decision step 512, it is determined if a DC component of the input signal passed to the second leg. If a DC component of the input signal passed to the second leg, then, in step 514, a second output for indicating a DC input signal is produced. After the second leg is prevented from producing a second output in step 510, or after the second output for indicating a DC input signal is produced in step 514, the method may repeat from step 500.

Certain terminology is used herein for purposes of reference only, and thus is not intended to be limiting. For example, terms such as "upper," "lower," "above," and "below" refer to directions in the drawings to which reference is made. Terms such as "front," "hack," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor" can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

The present invention may be part of a "safety system" used to protect human life and limb in a field, warehouse, factory or industrial environment. Nevertheless, the term "safety," "safely" or "safe" as used herein is not a representation that the present invention will make the environment safe or that other systems will produce unsafe operation. Safety in an industrial process depends on a wide variety of factors outside of the scope of the present invention including: design of the safety system, installation and maintenance of the components of the safety system, and the cooperation and training of individuals using the safety system. Although the present invention is intended to be highly reliable, all physical systems are susceptible to failure and provision must be made for such failure.

What is claimed is:

1. An electronic circuit for deciphering between an AC and a DC input signal comprising:
    an AC filter receiving an input signal and coupled to a first leg, the AC filter permitting an AC signal to pass to the first leg and preventing a DC signal from passing to the first leg; and
    a DC filter receiving the input signal and coupled to a second leg, the DC filter permitting a DC signal to pass to the second leg and preventing at least part of an AC signal from passing to the second leg;
    wherein the DC signal passing to the second leg causes the second leg to produce a second output for indicating the DC input signal, and the AC signal passing to the first leg causes the first leg to produce a first output for indicating an AC input signal and causes a lock out circuit to prevent the second leg from producing the second output.

2. The electronic circuit of claim 1, wherein the AC filter comprises a series capacitor.

3. The electronic circuit of claim 1, wherein the DC filter comprises a series diode.

4. The electronic circuit of claim 1, further comprising the first and second outputs coupled together to produce a third output for indicating an AC or a DC input signal.

5. The electronic circuit of claim 1, wherein the first and second outputs are coupled to light emitting diodes.

6. The electronic circuit of claim 1, wherein the first and second outputs produce audible tones.

7. The electronic circuit of claim 1, wherein the first and second outputs produce digital data signals.

8. The electronic circuit of claim 1, wherein the lock out circuit comprises a transistor in the second leg controlled by circuitry in the first leg.

9. A programmable logic controller module for providing power to a field device comprising:
    an enclosure;
    an electrical terminal on the enclosure coupled to a power signal;
    an AC filter contained in the enclosure receiving the power signal and coupled to a first leg of a circuit, the AC filter permitting an AC signal to pass to the first leg and preventing a DC signal from passing to the first leg; and
    a DC filter contained in the enclosure receiving the power signal and coupled to a second leg of the circuit, the DC filter permitting a DC signal to pass to the second leg and preventing at least part of an AC signal from passing to the second leg;
    wherein the DC signal passing to the second leg causes the second leg to produce a second output for indicating the DC power signal, and the AC signal passing to the first leg causes the first leg to produce a first output for indicating an AC power signal and causes a lock out circuit to prevent the second leg from producing the second output.

10. The programmable logic controller module of claim 9, wherein the AC filter comprises a series capacitor.

11. The programmable logic controller module of claim 9, wherein the DC filter comprises a series diode.

12. The programmable logic controller module of claim 9, further comprising the first and second outputs coupled together to produce a third output for indicating an AC or a DC input signal.

13. The programmable logic controller module of claim 9, wherein the first and second outputs are coupled to light emitting diodes.

14. The programmable logic controller module of claim 9, wherein the first and second outputs produce audible tones.

15. The programmable logic controller module of claim 9, wherein the first and second outputs produce digital data signals.

16. The programmable logic controller module of claim 9, wherein the lock out circuit comprises a transistor in the second leg controlled by circuitry in the first leg.

17. A method for deciphering between an AC and a DC input signal comprising:
    (a) receiving an input signal;
    (b) permitting an AC component of the input signal to pass to a first leg of a circuit while preventing a DC component of the input signal from passing to the first leg;
    (c) permitting a DC component of the input signal to pass to a second leg of the circuit while preventing at least part of an AC component of the signal from passing to the second leg; and
    (d) producing a second output for indicating a DC input signal following the DC component of the input signal passing to the second leg, and producing a first output for indicating an AC input signal and preventing the second leg from producing the second output following the AC component of the input signal passing to the first leg.

18. The method of claim 17, wherein producing an output illuminates a light emitting diode.

19. The method of claim 17, wherein producing an output produces an audible tone.

20. The method of claim 17, wherein producing an output produces a digital data signal.

* * * * *